United States Patent [19]

Kisor

[11] 4,037,267
[45] July 19, 1977

[54] PACKAGE FOR SEMICONDUCTOR COMPONENTS

[75] Inventor: Thaddeus William Kisor, Flemington, N.J.

[73] Assignee: RCA Corporation, New York, N.Y.

[21] Appl. No.: 689,268

[22] Filed: May 24, 1976

[51] Int. Cl.² .............................................. H05F 3/02
[52] U.S. Cl. .................................. 361/220; 174/52 R; 206/331
[58] Field of Search ............. 174/52 R, 52 FP, 138 F, 174/35 TS; 317/2 R; 206/328, 331, 334; 339/213 R, 213 T, 59 R, 59 M, 17 CF; 229/93

[56] References Cited

U.S. PATENT DOCUMENTS

| 941,745 | 11/1909 | Van Nostrand | 229/93 |
|---|---|---|---|
| 1,745,341 | 1/1930 | Schoettle | 229/93 |
| 2,521,613 | 9/1950 | Surks | 229/93 X |
| 2,692,077 | 10/1954 | Kuhlman | 206/334 X |
| 2,949,182 | 8/1960 | Williams | 206/331 |
| 3,441,661 | 4/1969 | Brummans | 174/138 F |
| 3,653,498 | 4/1972 | Kisor | 317/2 R X |
| 3,746,157 | 7/1973 | I'Anson | 206/331 |
| 3,774,075 | 11/1973 | Medesha | 317/2 R |
| 3,908,153 | 9/1975 | Cason | 317/2 R |

FOREIGN PATENT DOCUMENTS

| 1,485,609 | 5/1967 | France | 229/93 |

*Primary Examiner*—Bruce A. Reynolds
*Assistant Examiner*—D. A. Tone
*Attorney, Agent, or Firm*—H. Christoffersen; R. P. Williams; R. A. Hays

[57] ABSTRACT

A novel package for semiconductor components is disclosed. The package eliminates the need for covers or plugs at both ends of a hollow body wherein the components are placed. The novel package is easily adapted to provide anti-static protection for components susceptible to damage from electrostatic discharges across the terminals thereof.

9 Claims, 5 Drawing Figures

PACKAGE FOR SEMICONDUCTOR COMPONENTS

The present invention relates in general to packages for semiconductor components and in particular to packages for components requiring static charge protection.

The development of metal-oxide-semiconductor (MOS) devices simulatneously created a problem for the packaging of such completed devices for storage, shipping and the like. The problem is that an MOS device usually has a thin (about 1000 A) layer of insulator material, generally silicon dioxide, as a feature thereof. The layer, because of its thinness, is quite susceptible to dielectric breakdown by means of electrostatic discharges across the terminals of the component. Such discharges can easily damage or destroy the component.

One conventional solution to this problem is to insert the terminals of the component in a piece of conductive foam, such as polyolefin, for shipping and storage purposes. The foam maintains all of the terminals at the same potential. Another solution is to utilize a conductive material for the package itself, for example aluminum.

However, the rising costs of conductive foams and the increasing shortages of metals have made it desirable to provide a package which not only reduces the cost and weight of the package itself as well as the labor cost of the packaging procedure, but also provides the necessary static charge protection, at a reduced shipping cost.

Figure 1:
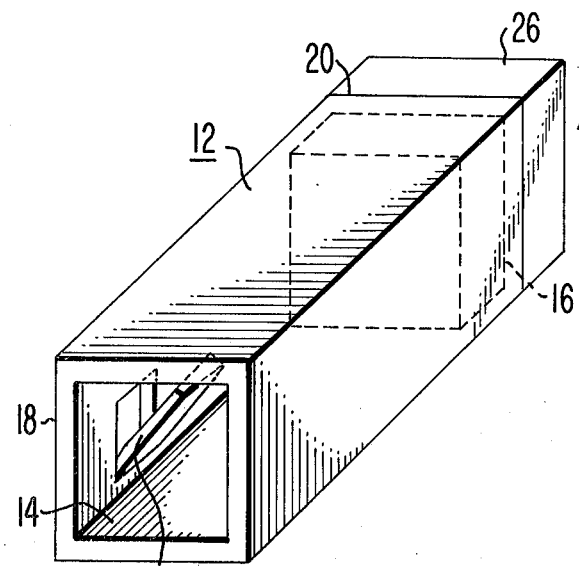
FIG. 1 is a pictorial representation of one embodiment of the present novel package, not drawn to scale.

One embodiment of the present novel package, indicated generally at 10 in FIG. 1, comprises a hollow body 12 having openings 14 and 16 at a first end 18 and a second end 20, respectively. While the length of the package 10 is not critical it will generally be elongated so as to accomodate a plurality of components 22, such as that shown in FIG. 4, for example. Preferably, the cross-sectional dimensions of the hollow body 12 are such that while the components 22 move freely in the elongated direction they are restrained from rotating or turning over in an end-to-end fashion. For reasons presented below, the body 12 is preferably made of a semi-rigid material, such as, for example, a plastic. In the preferred embodiment the plastic is a polyvinylchloride and the body 12 has a wall thickness, discussed below, of between from about 300 to about 500 micrometers (about 12 to 20 mils).

A protrusion 24 extends into the opening 14 near the first end 18. The protrusion 24 is an integral portion of the hollow body 12. The protrusion 24 extends inwardly across the opening 14 near the first end 18 in such a mannner and for such a distance so as to provide means for preventing the ingress or egress of components 22 through the opening 14.

Removable means 26 for preventing the ingress or egress of semiconductor components 22 through the opening 16 is provided at the second end 20 of the body 12. While shown in FIG. 1 as a plug, the means 26 can also be a cover fitting over the body 12. In some cases the means 26 may simply be a piece of adhesive type tape attached across the second opening 16.

Figure 2:
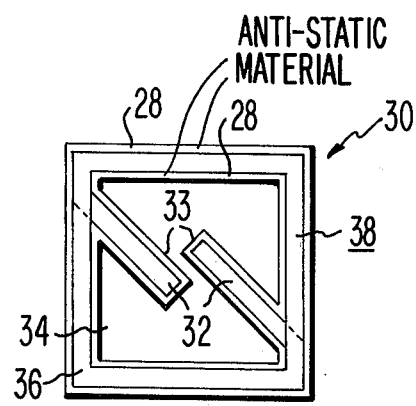
FIGS. 2 and 3 are frontal views of a second and a third embodiment of the present package, not drawn to scale.
Figure 3:
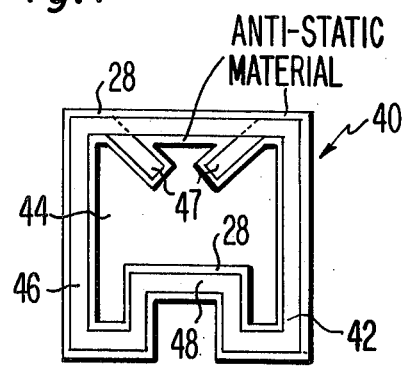

A thin film coating 28 of anti-static material, shown only in FIGS. 2 and 3 for clarity, can be formed on the package 10 and the means 26. The anti-static film coating 28 may be any one of a number of such products available in the industry. Preferably, however, Cya-Stat 609 is used. Cya-Stat 609 is a product manufactured and marketed by American Cyanamid, Inc.

In a second embodiment, designated by numeral 30 in FIG. 2, a pair of protrusions 32 are shown extending into an opening 34 at a first end 36 of a hollow body 38. The use of more than one protrusion 32 is advantageous in that it provides less chance for a semiconductor component, such as 22, to fall out of the package 30. Such a pair of protrusions 32 also allows smaller components to be stored in the package 30. That is, components which may be sufficiently small so as to be able to pass across the opening 14 in the package 10 are retained in the package 30. Further, in the package 30, each protrusion 32 can be smaller in length, since each is only required to block one half of the opening 34, than the single protrusion 24 of the package 10. It should be noted that the overlapping portions 33 of the protrusions 32 of the package 38 may be attached to one another in a rigid fashion, for example by glue or some form of an interlock. This, however, is not critical to the present invention. As shown in FIG. 2 the body 38 is a rectangle having four walls. The protrusions 32 preferably extend inwardly from two opposing walls.

Figure 4:
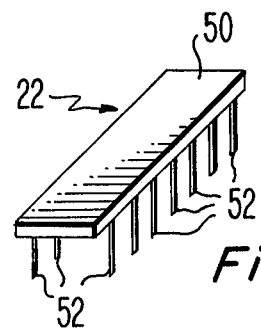
FIG. 4 is a pictorial representation of a typical semiconductor component, not drawn to scale.

A third embodiment is shown in FIG. 3, generally indicated by the numeral 40. The package 40 is comprised of a hollow body 42 having an opening 44 near a first end 46 thereof. In addition to a pair of protrusions 47 the package 40 has a rail 48 extending inwardly into the opening 44. While shown in FIG. 3 as being an integral indented portion of the perimeter of the body 42 the rail 48 may be an integral extension of the body 42. The rail 48 as shown in FIG. 3 is preferred, however, since body material is conserved. The rail 48 provides a guide for the positioning of components, particularly those components which are dual-in-line structures, such as component 22 shown in FIG. 4. Referring to FIG. 4, the component 22 has a main body 50 with a plurality of leads 52 extending downwardly on both sides of the body 50. The body 50 is placed on or above the rail 48 with the leads 52 on its sides located on the respective sides of the rail 48. The rail 48 serves to not only guide the movement of the components 22 along the hollow body 42 but also helps prevent any rotation of the components 22 therein. The protrusions 47 of the package 40 perform the same function as the protrusion 24 or 32 of the packages 10 or 30 respectively. While not shown in FIGS. 2 or 3, a plug, cover or the like, similar to the means 26 shown in FIG. 1, can be used with the packages 30 and 40.

The hollow body 12, 38 or 42 of the packages 10, 30 or 40 respectively are preferably formed by known extrusion processes, or the like. A description of one method of forming the protrusions 24, 32 and 47 is presented below in conjunction with FIG. 5 of the drawings.

Figure 5:
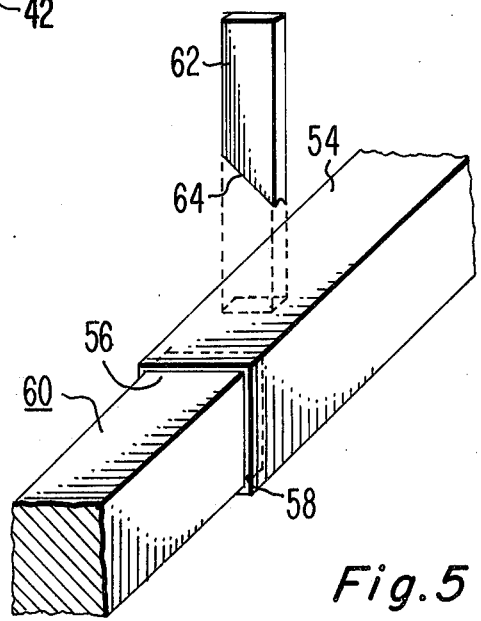
FIG. 5 is a pictorial view of one step in the manufacture of the present package, not drawn to scale.

Referring now to FIG. 5 there is shown therein an extruded hollow body 54 having an opening 56 near a first end 58. A supporting insert 60 is placed through the opening 56 into the body 54. The insert 60, which, as will become clear, is preferably made of a strong metal, penetrates the body 54 to a point just short of where a protrusion, or protrusions, is to be formed. A knife 62 having a beveled edge 64, is then driven, for example, by hydraulic means, into the body 54. The knife 62 preferably penetrates the body 54 to the depth of the beveled edge 64. The knife 62 is then removed and a protrusion, such as 24, 32 or 46, remains. The supporting insert 60 prevents the body 54 from collapsing during the driving step. As mentioned above, the material of the body 54 should be semirigid, such as, for example, a plastic. That is, if the body material is rigid, either the knife 62 will not penetrate the material or, more likely, the protrusion will break from the body 54 during the cutting. On the other hand, if the body material is completely without rigidity it will not maintain the desired shape of the body 54.

The anti-static coating 28 may be applied to all embodiments of the present novel package by means of dip-coating. Dip-coating is a known procedure in the art wherein an item to be coated is immersed in a coating fluid which may be either full strength of diluted. Upon removal of the item from the coating material it is allowed to dry, sometimes, depending on its properties with the aid of a following warm air, thereby forming a solid film on all surfaces of the item.

The present novel packages 10, 30 and 40 provide inexpensive non-metallic packages which can be easily provided with an anti-static coating. Since only one plug, cover or the like is used with each package a considerable labor cost saving results. This labor cost savings is significant when a volume of millions of such packages is considered. The shipping cost savings are also significant because of the thin walls, and relatively simple shapes which are possible.

What is claimed is:

1. A package for semiconductor components comprising:
    a hollow body having openings at a first end and a second end;
    at least one protrusion extending into said opening at said first end of said body, said protrusion being an integral portion of said body and preventing the ingress or egress of said components through said opening at said first end; and
    a coating of anti-static material covering said body.
2. A package for semiconductor components as claimed in claim 1 further comprising:
    removable means for preventing the ingress or egress of components through said opening at said second end.
3. A package for semiconductor components as claimed in claim 2 further comprising:
    a coating of anti-static material covering said means.
4. A package for semiconductor components as claimed in calim 1 wherein:
    said hollow body is rectangular and has four walls; and
    said protrusion extends inwardly from two opposing walls.
5. A package for semiconductor components as calimed in claim 1 further comprising:
    a rail-like indentation in said body, which indentation serves as a guide for said components.
6. A package for semiconductor components as claimed in claim 1 wherein:
    said package body material is semi-rigid.
7. A package for semiconductor components as claimed in claim 1 wherein:
    said package body material is a plastic.
8. A package for semiconductor components as claimed in claim 7 wherein:
    said plastic is polyvinylchloride.
9. A package for semiconductor components as claimed in claim 7 wherein:
    said plastic is between from about 300 micrometers to about 500 micrometers thick.

* * * * *

Disclaimer 4,037,267.—*Thaddeus William Kisor*, Flemington, N.J. PACKAGE FOR SEMICONDUCTOR COMPONENTS. Patent dated July 19, 1977. Disclaimer filed Aug. 30, 1978, by the assignee, *RCA Corporation*.
Hereby enters this disclaimer to claims 1–9 inclusive of said patent.
[*Official Gazette October 17, 1978.*]